United States Patent
Aono et al.

(10) Patent No.: US 9,299,818 B2
(45) Date of Patent: Mar. 29, 2016

(54) INSULATING GATE-TYPE BIPOLAR TRANSISTOR

(75) Inventors: Shinji Aono, Tokyo (JP); Tadaharu Minato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/395,914

(22) PCT Filed: May 29, 2012

(86) PCT No.: PCT/JP2012/063687
§ 371 (c)(1),
(2), (4) Date: Oct. 21, 2014

(87) PCT Pub. No.: WO2013/179379
PCT Pub. Date: Dec. 5, 2013

(65) Prior Publication Data
US 2015/0129930 A1    May 14, 2015

(51) Int. Cl.
*H01L 29/739* (2006.01)
*H01L 29/06* (2006.01)
*H01L 29/10* (2006.01)
(Continued)

(52) U.S. Cl.
CPC ........ *H01L 29/7393* (2013.01); *H01L 29/0634* (2013.01); *H01L 29/0696* (2013.01); *H01L 29/1095* (2013.01); *H01L 29/36* (2013.01); *H01L 29/4236* (2013.01); *H01L 29/7397* (2013.01)

(58) Field of Classification Search
CPC ............ H01L 29/0696; H01L 29/1095; H01L 29/66325; H01L 29/7302; H01L 29/7393; H01L 29/7395; H01L 29/7397
See application file for complete search history.

(56) References Cited

U.S. PATENT DOCUMENTS 6,040,600 A    3/2000  Uenishi et al.
6,103,578 A    8/2000  Uenishi et al.
(Continued)

FOREIGN PATENT DOCUMENTS

JP    H10-223896 A    8/1998
JP    2000-260984 A   9/2000
(Continued)

OTHER PUBLICATIONS

International Search Report; PCT/JP2012/063687; Jul. 3, 2012.
(Continued)

*Primary Examiner* — Eduardo A Rodela
(74) *Attorney, Agent, or Firm* — Studebaker & Brackett PC

(57) ABSTRACT

An object of the present invention is to provide a trench gate type IGBT achieving both retention of withstand voltage and lowering of ON-state voltage and to provide a method for manufacturing the trench gate type IGBT. The IGBT according to the present invention is an SJ-RC-IGBT which includes a drift layer having super junction structure, and includes an IGBT area and an FWD area on the rear surface. In the IGBT according to the present invention, a first drift layer has an impurity concentration of $1\times10^{15}$ atms/cm$^3$ or higher and lower than $2\times10^{16}$ atms/cm$^3$, and a thickness of 10 µm or larger and smaller than 50 µm; and that a buffer layer has an impurity concentration of $1\times10^{15}$ atms/cm$^3$ or higher and lower than $2\times10^{16}$ atms/cm$^3$, and a thickness of 2 µm or larger and smaller than 15 µm.

9 Claims, 7 Drawing Sheets

(51) Int. Cl.
H01L 29/36 (2006.01)
H01L 29/423 (2006.01)

(56) References Cited

U.S. PATENT DOCUMENTS

| | | | |
|---|---|---|---|
| 6,204,097 B1* | 3/2001 | Shen et al. | 438/133 |
| 7,847,345 B2 | 12/2010 | Takahashi | |
| 8,482,030 B2* | 7/2013 | Aono et al. | 257/139 |
| 2002/0036319 A1* | 3/2002 | Baliga | 257/328 |
| 2005/0017290 A1* | 1/2005 | Takahashi et al. | 257/328 |
| 2005/0269632 A1* | 12/2005 | Hsu | 257/335 |
| 2006/0118866 A1* | 6/2006 | Yanagida et al. | 257/343 |
| 2009/0134434 A1* | 5/2009 | Werner | 257/256 |
| 2009/0159963 A1* | 6/2009 | Yamaguchi et al. | 257/328 |
| 2012/0153348 A1* | 6/2012 | Aono et al. | 257/139 |

FOREIGN PATENT DOCUMENTS

| | | |
|---|---|---|
| JP | 2003-303965 A | 10/2003 |
| JP | 2004-158868 A | 6/2004 |
| JP | 2006-287127 A | 10/2006 |
| JP | 2008-053648 A | 3/2008 |
| JP | 2010-147182 A | 7/2010 |
| JP | 2012-142537 A | 7/2012 |

OTHER PUBLICATIONS

M. Antoniou et al.; "A new way to alleviate the RC IGBT snapback phenomenon: The Super Junction Solution"; ISPSD 2010; pp. 153-156.

T. Minato et al.; "Which is cooler, Trench or Multi-Epitaxy?"; ISPSD 2000; pp. 73-76.

T. Nitta et al.; "Experimental Results and Simulation Analysis of 250V Super Trench Power MOSFET (STM)"; ISPSD 2000; pp. 77-80.

H. Takahashi et al.; "1200V Reverse Conducting IGBT"; ISPSD 2004; pp. 133-136.

Notification Concerning Transmittal of International Preliminary Report on Patentability and Translation of Written Opinion of the International Searching Authority; PCT/JP2012/063687 issued on Dec. 11, 2014.

An Office Action; "Notice of Reasons for Rejection," issued by the Japanese Patent Office on Feb. 3, 2015, which corresponds to Japanese Patent Application No. 2014-518116 and is related to U.S. Appl. No. 14/395,914; with English language partial translation.

An Office Action issued by the Korean Patent Office on Sep. 28, 2015, which corresponds to Korean Patent Application No. 10-2014-7031076 and is related to U.S. Appl. No. 14/395,914; with English language partial translation.

* cited by examiner

FIG. 2

| | REPETITION PITCH OF DRIFT LAYER [μm] | L1 [μm] | IMPURITY CONCENTRATION OF N-DRIFT LAYER [atms/cm$^3$] | THICKNESS OF N BUFFER LAYER [μm] | IMPURITY CONCENTRATION OF N BUFFER LAYER [atms/cm$^3$] | L3 [μm] |
|---|---|---|---|---|---|---|
| Aa | 6 | 30 | $1.4 \times 10^{15}$ | 5 | $4.9 \times 10^{15}$ | 90 |
| Ab | 6 | 30 | $4.2 \times 10^{15}$ | 5 | $4.9 \times 10^{15}$ | 90 |
| Ac | 6 | 30 | $8.3 \times 10^{15}$ | 5 | $4.9 \times 10^{15}$ | 90 |
| Ad | 6 | 30 | $1.0 \times 10^{16}$ | 5 | $4.9 \times 10^{15}$ | 90 |
| Bc | 6 | 35 | $8.3 \times 10^{15}$ | 5 | $4.9 \times 10^{15}$ | 90 |
| Bd | 6 | 35 | $1.0 \times 10^{16}$ | 5 | $4.9 \times 10^{15}$ | 90 |
| Db | 6 | 45 | $4.2 \times 10^{15}$ | 5 | $4.9 \times 10^{15}$ | 90 |
| Bc2 | 6 | 35 | $8.3 \times 10^{15}$ | 5 | $1.0 \times 10^{16}$ | 90 |
| Bd2 | 6 | 35 | $1.0 \times 10^{16}$ | 5 | $1.0 \times 10^{16}$ | 90 |

F I G . 3
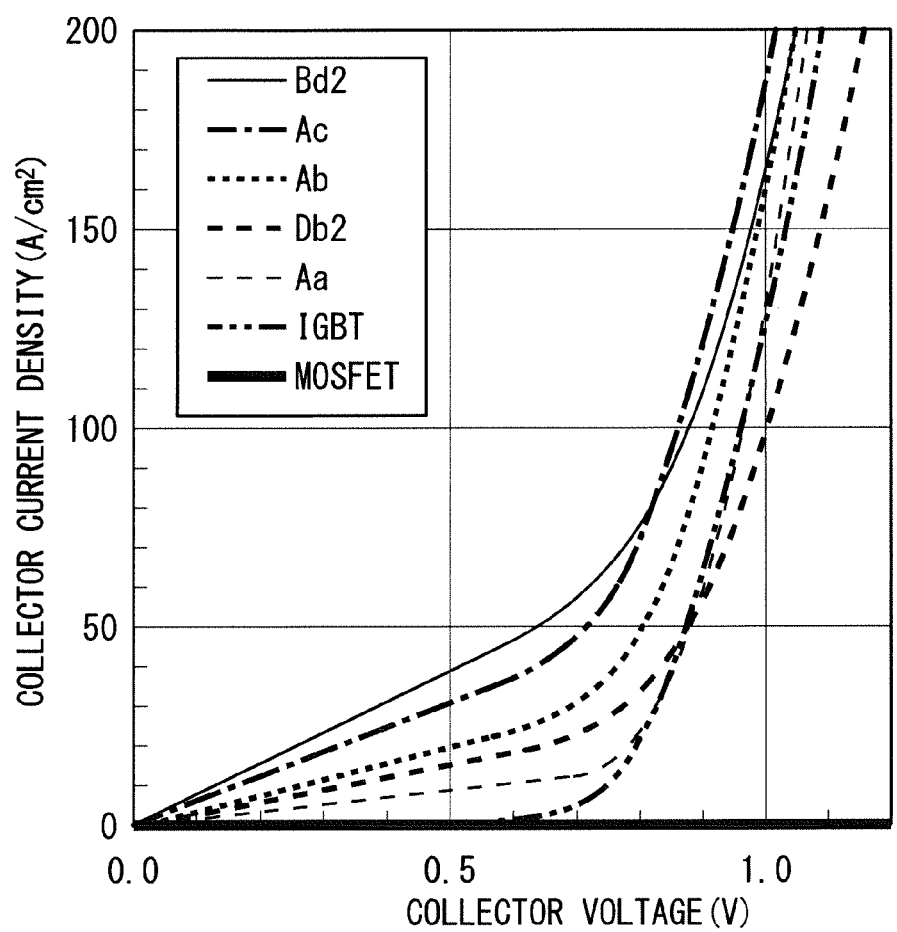

F I G . 4
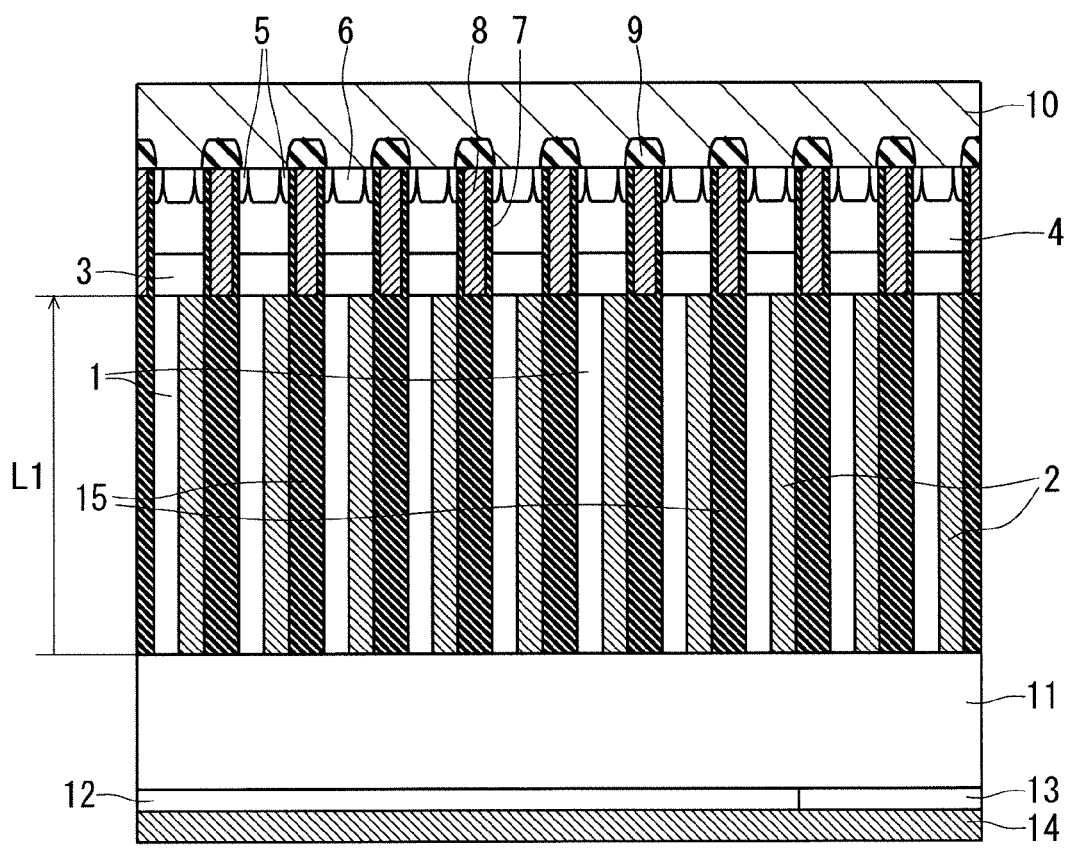

F I G . 5
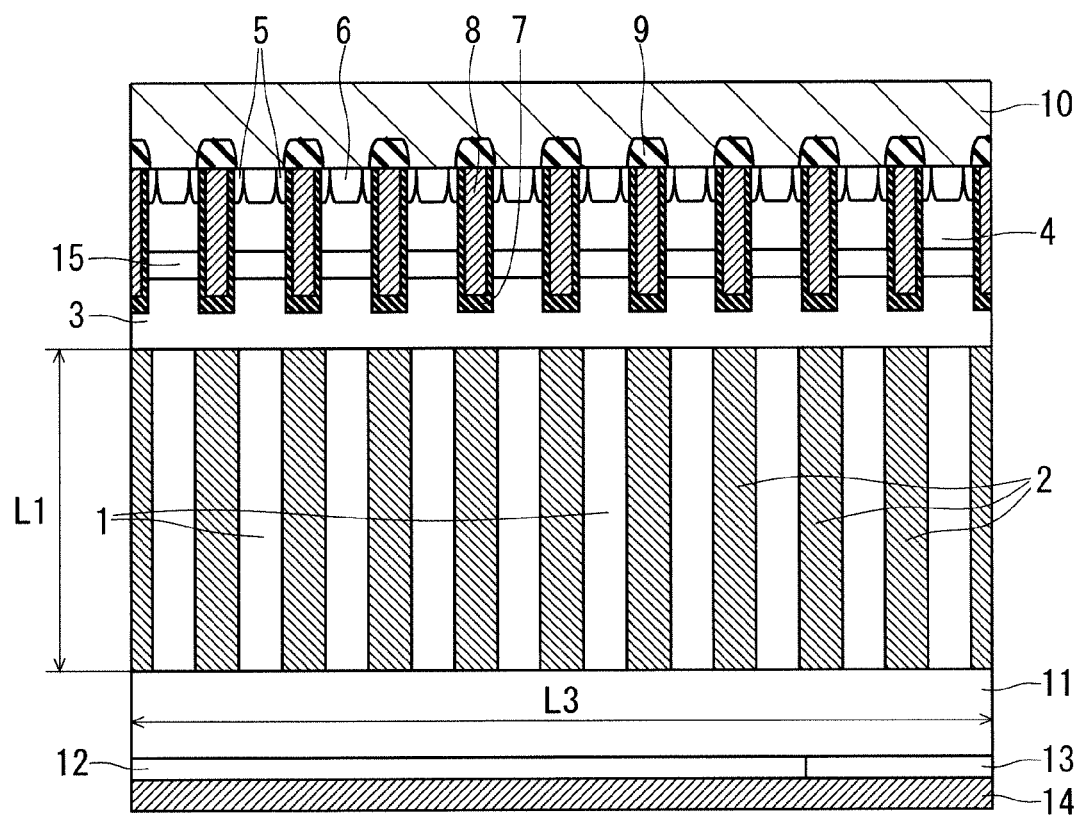

F I G . 8
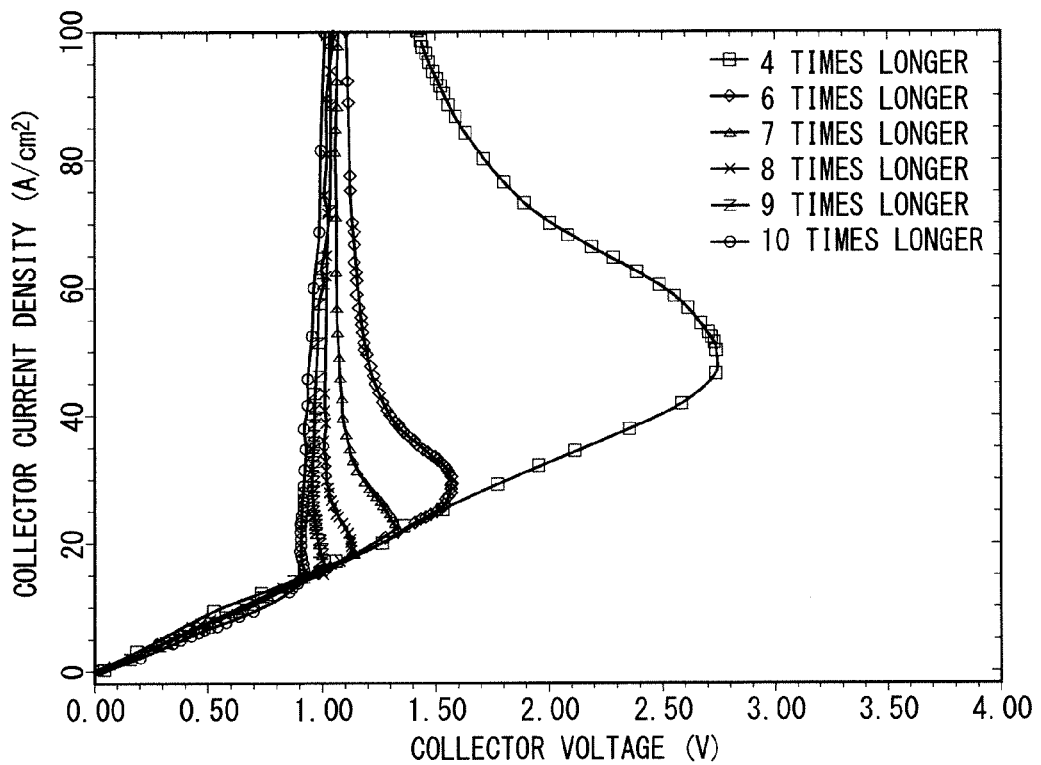

INSULATING GATE-TYPE BIPOLAR TRANSISTOR

TECHNICAL FIELD

The present invention relates to a reverse-conducting insulating gate-type bipolar transistor, particularly to an insulating gate-type bipolar transistor improving ON-state voltage and forward voltage drop of a diode at the time of reverse conduction.

BACKGROUND ART

In recent years, an inverter device has been used in fields of household electric articles, industrial electric power apparatuses, and the like. An inverter device using commercial power source (alternating current source) includes a converter part which implements forward conversion from alternating current source into direct current, a smoothing circuit part, and an inverter part which implements reverse conversion from direct current voltage into alternating current. A main power element of the inverter part is chiefly constituted by an insulating gate-type bipolar transistor (hereinafter sometimes referred to as an IGBT (Insulated Gate Bipolar Transistor)) capable of achieving high-speed switching.

According to an inverter device for power control, a current rating and a voltage rating per one chip of a transistor range approximately from several amperes to several hundred amperes, and approximately from several hundred volts to several thousand volts, respectively. Accordingly, in the case of a circuit operated by successive changes of the gate voltage of an IGBT by using resistance loads, power corresponding to a product of current and voltage is generated as heat inside the IGBT. This condition produces necessity for equipment of a large radiator, and deteriorates conversion efficiency of power. Moreover, an increase in temperature of the transistor itself causes thermal destruction depending on a combination of operating voltage and operating current. For this reason, a resistance load circuit is not generally used.

The load of an inverter device is provided by an electric induction motor (inductive load motor) in many cases. Therefore, an IGBT generally operates as a switch, and controls power energy by repeating ON-state and OFF-state. In switching an inverter circuit using an inductive load, possible conditions are a turn-off process from ON-state to OFF-state of a transistor, a turn-on process from OFF-state to ON-state of a transistor, and an ON-state of a transistor.

The inductive load connects with an intermediate potential point between upper and lower arms, wherefore a direction of current flow in the inductive load is both positive direction and negative direction. The current flowing in the load is returned from the load connection end toward the high-potential power source side, or drawn toward the ground side. Accordingly, equipment of a free wheel diode is needed for the purpose of circulation of large current flowing in the inductive load between the load and the closed circuits of arms. FIG. 6 shows an inverter circuit (full-bridge circuit) using a conventional IGBT and a free wheel diode. In the case of a small-capacity inverter device, an MOSFET (Metal Oxide Silicon Field Effect Transistor) is used instead of an IGBT in some cases.

A trench gate type IGBT (see Patent Document 1), a carrier accumulating-type trench gate IGBT, and others are proposed as a structure lowering ON-state voltage of an IGBT. In addition, a reverse-conducting-type IGBT (RC-IGBT) containing the function of a free-wheel diode in one chip is proposed (see Non Patent Documents 1 and 2).

PRIOR ART DOCUMENT

Patent Document

Patent Document 1: Japanese Patent Application Laid-Open No. 2004-158868

Non Patent Documents

Non Patent Document 1: Hideki Takahashi et al., "1200V Reverse Conducting IGBT", ISPSD2004
Non Patent Document 2: M. Antoniou et al., "A new way to alleviate the RC IGBT snapback phenomenon: The Super Junction Solution", ISPSD2010

SUMMARY OF INVENTION

Problems to be Solved by the Invention

According to a trench gate type IGBT described in Patent Document 1, an N-base layer having a certain thickness is needed for retaining withstand voltage. However, when the thickness of the N-base layer increases, such a problem arises that the ON-state voltage rises accordingly.

Therefore, in consideration of the aforementioned problems, it is an object of the present invention to provide a trench gate type IGBT achieving both retention of withstand voltage and lowering of ON-state voltage, and having a large current density range for unipolar operation, and to provide a method for manufacturing the IGBT.

Means for Solving the Problems

A first insulating gate-type bipolar transistor according to the present invention is an insulating gate-type semiconductor device including: a first conductivity-type buffer layer; a first drift layer provided on a first main surface of the buffer layer; a first conductivity-type second drift layer provided on the first drift layer; a second conductivity-type base layer provided on the second drift layer; a first conductivity-type emitter layer selectively provided on the front surface of the base layer; a gate electrode penetrating from the front surface of the emitter layer into the second drift layer to be embedded with an insulating gate film interposed between the gate electrode and the surroundings; an emitter electrode having conductivity with the emitter layer; a collector layer provided on a second main surface of the buffer layer; and a collector electrode provided on the collector layer, wherein the first drift layer has a structure containing first conductivity-type first layers and second conductivity-type second layers repeated in the horizontal direction, the collector layer has a structure containing second conductivity-type first collector layers and first conductivity-type second collector layers repeated in the horizontal direction, the first drift layer has an impurity concentration of $1\times10^{15}$ atms/cm$^3$ or higher and lower than $2\times10^{16}$ atms/cm$^3$, and a thickness of 10 μm or larger and smaller than 50 μm, and the buffer layer has an impurity concentration of $1\times10^{15}$ atms/cm$^3$ or higher and lower than $2\times10^{16}$ atms/cm$^3$, and a thickness of 2 μm or larger and smaller than 15 μm.

A second insulating gate-type bipolar transistor according to the present invention is an insulating gate-type semiconductor device including: a first conductivity-type buffer layer; a first drift layer provided on a first main surface of the buffer layer; a first conductivity-type second drift layer provided on the first drift layer; a second conductivity-type base layer provided on the second drift layer; a first conductivity-type emitter layer selectively provided on the front surface of the base layer; a gate electrode penetrating from the front surface of the emitter layer into the second drift layer to be embedded with an insulating gate film interposed between the gate electrode and the surroundings; an emitter electrode having conductivity with the emitter layer; a collector layer provided on a second main surface of the buffer layer; and a collector electrode provided on the collector layer, wherein the first drift layer has a structure containing first conductivity-type first layers, insulating layers, and second conductivity-type second layers repeated in this order in the horizontal direction, the collector layer has a structure containing second conductivity-type first collector layers and first conductivity-type second collector layers repeated in the horizontal direction, the first layers and the second layers have an impurity concentration of $1 \times 10^{15}$ atms/cm$^3$ or higher and lower than $2 \times 10^{16}$ atms/cm$^3$, the first drift layer has a thickness of 10 μm or larger and smaller than 50 μm, and the buffer layer has an impurity concentration of $1 \times 10^{15}$ atms/cm$^3$ or higher and lower than $2 \times 10^{16}$ atms/cm$^3$, and a thickness of 2 μm or larger and smaller than 15 μm.

Effects of the Invention

The first insulating gate-type bipolar transistor according to the present invention is an insulating gate-type semiconductor device including: the first conductivity-type buffer layer; the first drift layer provided on the first main surface of the buffer layer; the first conductivity-type second drift layer provided on the first drift layer; the second conductivity-type base layer provided on the second drift layer; the first conductivity-type emitter layer selectively provided on the front surface of the base layer; the gate electrode penetrating from the front surface of the emitter layer into the second drift layer to be embedded with the insulating gate film interposed between the gate electrodes and the surroundings; the emitter electrode having conductivity with the emitter layer; the collector layer provided on the second main surface of the buffer layer; and the collector electrode provided on the collector layer, wherein the first drift layer has a structure containing the first conductivity-type first layers and the second conductivity-type second layers repeated in the horizontal direction, the collector layer has a structure containing the second conductivity-type first collector layers and the first conductivity-type second collector layers repeated in the horizontal direction, the first drift layer has an impurity concentration of $1 \times 10^{15}$ atms/cm$^3$ or higher and lower than $2 \times 10^{16}$ atms/cm$^3$, and a thickness of 10 μm or larger and smaller than 50 μm, and the buffer layer has an impurity concentration of $1 \times 10^{15}$ atms/cm$^3$ or higher and lower than $2 \times 10^{16}$ atms/cm$^3$, and a thickness of 2 μm or larger and smaller than 15 μm. Accordingly, MOSFET operation (unipolar operation) is allowed in a relatively high current density range which ranges approximately from 1/10 to 1/2 of the rated current density at the time of forward conduction. As a consequence, the voltage drop characteristics of the RC-IGBT can approach those of MOSFET having a low ON-state resistance, and the snapback voltage also becomes a low voltage. Furthermore, voltage drop of diodes performing reverse conducting operation can also be decreased by reduction of the thickness of the base layer.

The second insulating gate-type bipolar transistor according to the present invention is an insulating gate-type semiconductor device including: the first conductivity-type buffer layer; the first drift layer provided on the first main surface of the buffer layer; the first conductivity-type second drift layer provided on the first drift layer; the second conductivity-type base layer provided on the second drift layer; the first conductivity-type emitter layer selectively provided on the front surface of the base layer; the gate electrode penetrating from the front surface of the emitter layer into the second drift layer to be embedded with the insulating gate film interposed between the gate electrode and the surroundings; the emitter electrode having conductivity with the emitter layer; the collector layers provided on the second main surface of the buffer layer; and the collector electrode provided on the collector layer, wherein the first drift layer has a structure containing the first conductivity-type first layers, the insulating layers, and the second conductivity-type second layers repeated in this order in the horizontal direction, the collector layer has a structure containing the second conductivity-type first collector layers and the first conductivity-type second collector layers repeated in the horizontal direction, the first layers and the second layers have an impurity concentration of $1 \times 10^{15}$ atms/cm$^3$ or higher and lower than $2 \times 10^{16}$ atms/cm$^3$, the first drift layer has a thickness of 10 μm or larger and smaller than 50 μm, and the buffer layer has an impurity concentration of $1 \times 10^{15}$ atms/cm$^3$ or higher and lower than $2 \times 10^{16}$ atms/cm$^3$, and a thickness of 2 μm or larger and smaller than 15 μm. Accordingly, the MOSFET operation (unipolar operation) is allowed in a relatively high current density range which ranges approximately from 1/10 to 1/2 of the rated current density at the time of forward conduction. As a consequence, the voltage drop characteristics of the RC-IGBT can approach those of MOSFET having a low ON-resistance, and the snapback voltage also becomes a low voltage. Furthermore, voltage drop of diodes performing reverse conducting operation can also be decreased by reduction of the thickness of the base layer.

These and other objects, features, aspects and advantages of the present invention will become more apparent from the following detailed description of the present invention when taken in conjunction with the accompanying drawings.

BRIEF DESCRIPTION OF DRAWINGS

FIG. 2 is a diagram showing parameters for device simulations of the insulating gate-type bipolar transistor according to the first embodiment.

FIG. 3 is a diagram showing a result of the device simulations of the insulating gate-type bipolar transistor according to the first embodiment.

FIG. 4 is a cross-sectional view of an insulating gate-type bipolar transistor according to a modified example of the first embodiment.

FIG. 5 is a cross-sectional view of an insulating gate-type bipolar transistor according to a second embodiment.

FIG. 8 is a diagram showing a result of device simulations of the insulating gate-type bipolar transistor according to the art of premise on which the present invention is based.

DESCRIPTION OF EMBODIMENTS

A. Art of Premise

Figure 7:
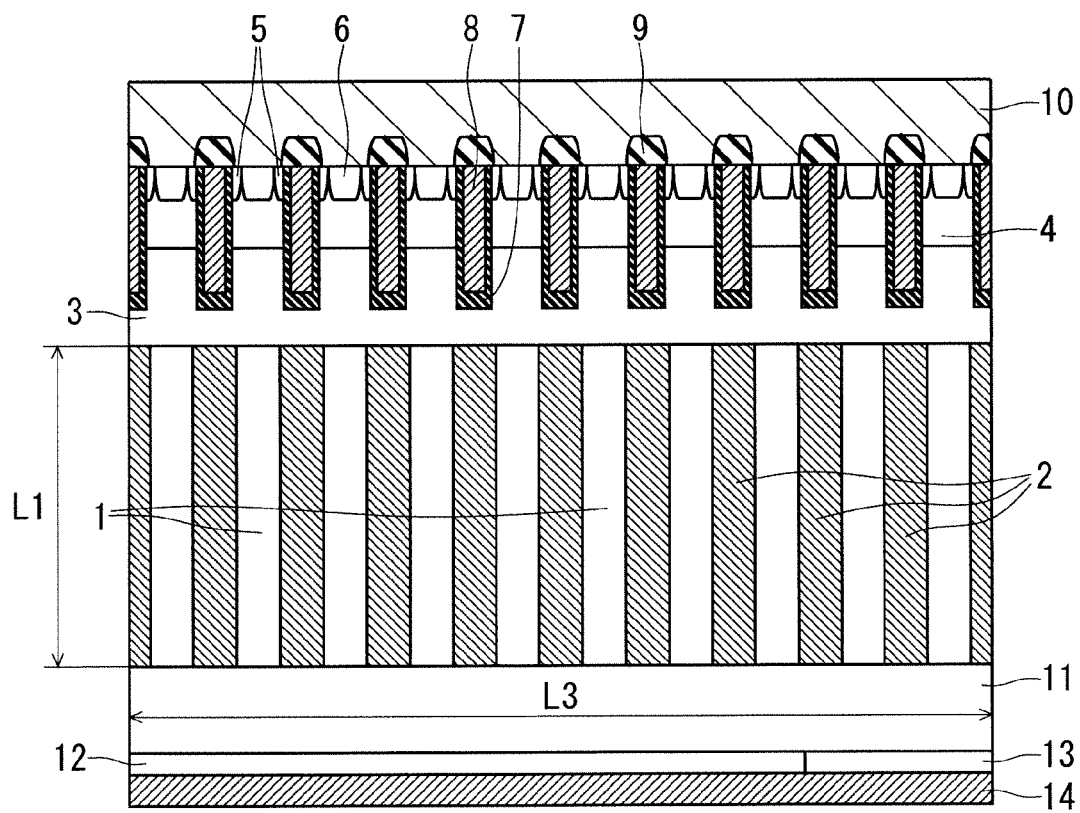
FIG. 7 is a cross-sectional view of an insulating gate-type bipolar transistor according to an art of premise on which the present invention is based.

FIG. 7 is a cross-sectional view illustrating the structure of a reverse-conducting insulating gate-type bipolar transistor (SJ-RC-IGBT) according to an art of premise on which the present invention is based.

According to the SJ-RC-IGBT in this embodiment, a drift layer is formed on a first main surface of an N buffer layer 11. The drift layer has a double-layer structure constituted by a first drift layer, and an N-drift layer 3 corresponding to a second drift layer. The first drift layer has a super junction structure containing N-drift layers 1 as first layers, and P-drift layers 2 as second layers repeated in the horizontal direction in the figure, and is produced by injection, diffusion, and epitaxial growth steps. It is assumed that each of the N-drift layers 1 and the P-drift layers 2 has a thickness L1.

A P base layer 4 is provided on the N-drift layer 3. N emitter layers 5 and P+ contact layers 6 are provided on the front surface of the P base layer 4.

Trenches are so formed as to extend from the front surfaces of the N emitter layers 5 to an intermediate position of the N-drift layer 3 while penetrating the P base layer 4. Gate electrodes 8 are provided within the trenches with insulating gate films 7 interposed between the gate electrodes 8 and the trenches. An emitter electrode 10 is provided on the P+ contact layers 6. The gate electrodes 8 and the emitter electrode 10 are insulated from each other via interlayer dielectrics 9.

P collector layers 12 and N collector layers 13 are repeated on a second main surface of the N buffer layer 11 in the horizontal direction in the figure. It is assumed that the P collector layers 12 and the N collector layers 13 have a repetition pitch L3. A collector electrode 14 is provided on the rear surfaces of the P collector layers 12 and the N collector layers 13.

Next, operation is described. When a positive voltage having a threshold Vth or higher is applied to the gate electrodes 8, the area of the P base layer 4 disposed between the N emitter layers 5 and the N-drift layer 3 is reversed to N type. As a result, electrons are injected from the N emitter layers 5 into the N-drift layer 3, whereby the SJ-RC-IGBT comes into the conductive state in the forward direction. When a collector voltage higher than the voltage for forward bias of the PN junction of the P collector layers 12 and the N buffer layer 11 is applied to the collector electrode 14 in the conductive state, holes are injected from the collector electrode 14 into the N-drift layers 1. This condition causes conductivity modulation and rapid drop of resistances of the first and second drift layers, and thus provides sufficient energizing capability.

On the other hand, a negative bias is applied to the gate electrodes 8, and a predetermined voltage (emitter electrode<rear-surface collector electrode) is applied between the emitter electrode 10 and the collector electrode 14. In this case, this transistor produces a depletion layer extended from the P base layer 4 on the front surface toward the N-drift layer 3 and the N-drift layers 1 or P-drift layers 2. This condition completely depletes the super junction structure, and thus allows retention of withstand voltage.

FIG. 8 is a diagram showing the relationship between the collector voltage and the collector current density when the repetition pitch of the collector layer (P collector layers 12 and N collector layers 13) is set to a pitch ranging from four times longer to ten times longer than the repetition pitch of the first drift layer (N-drift layers 1 and P-drift layers 2). As can be seen from FIG. 8, the snapback voltage becomes lower when the repetition pitch of the collector layer is a long pitch. However, the current density at which MOSFET operation switches to IGBT operation was not able to be raised when the respective impurity concentrations and thicknesses of the N buffer layer 11, the N-drift layers 1, and the P-drift layers 2 were not appropriately set. In the conventional combinations of parameters, the maximum current density at which MOSFET operation is performed was approximately 20 A/cm$^2$, which is approximately in the range from 1/10 to 1/5 of the rated current density.

Considering as above, an SJ-RC-IGBT according to the present invention allows execution of MOSFET operation even at a high current density by appropriate setting of the impurity concentrations and thicknesses of the N buffer layer 11, the N-drift layers 1, and the P-drift layers 2.

B. First Embodiment

Figure 1:
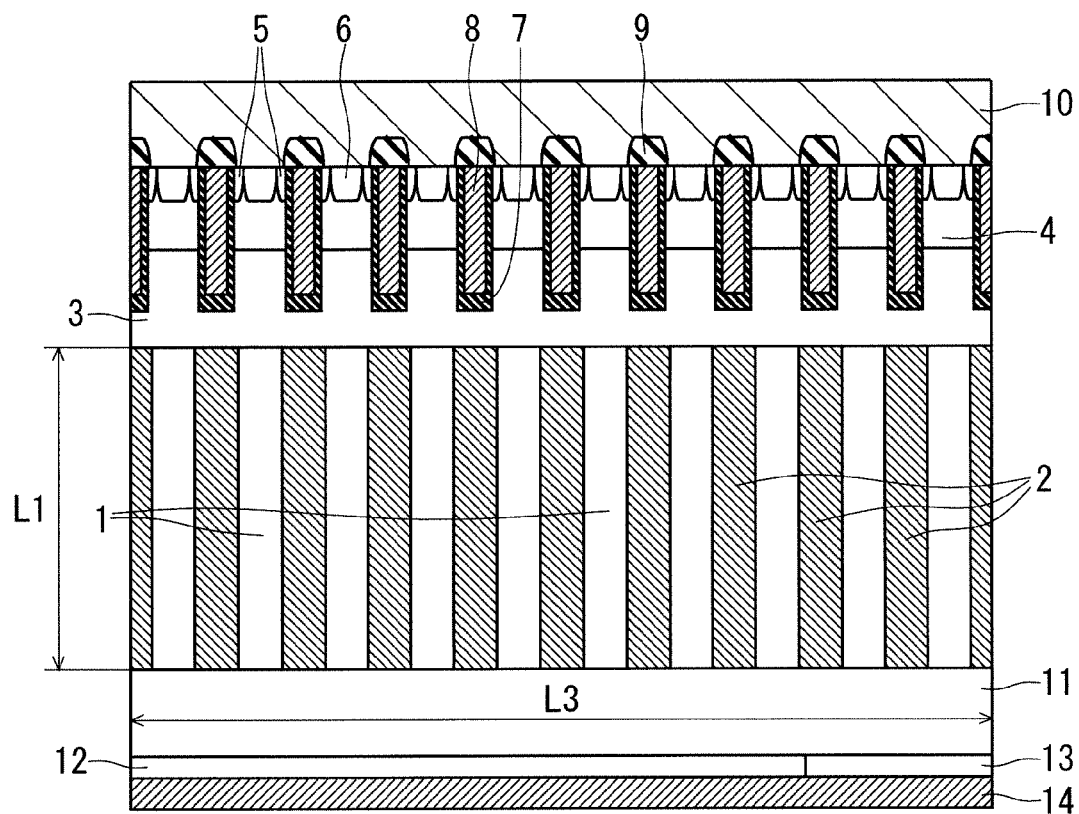
FIG. 1 is a cross-sectional view of an insulating gate-type bipolar transistor according to a first embodiment.
Figure 6:
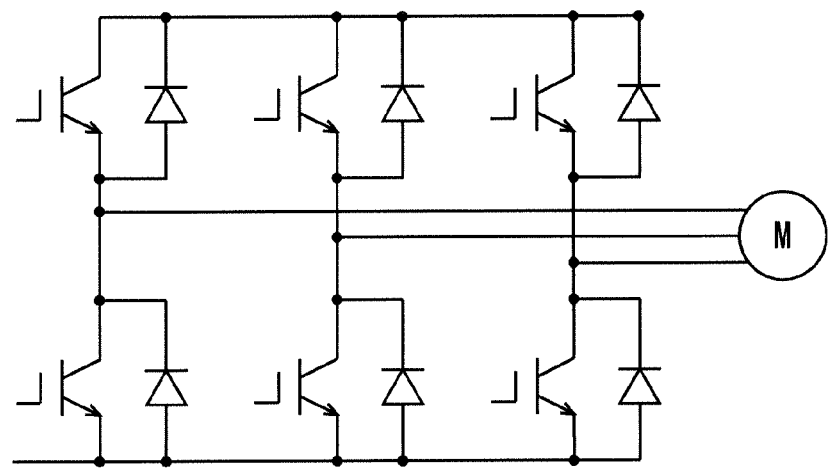
FIG. 6 is a diagram showing a full-bridge circuit.

FIG. 1 is a cross-sectional view of an SJ-RC-IGBT according to this embodiment. The constitutions illustrated in FIG. 1 are identical to the corresponding constitutions illustrated in FIG. 7, and the structure and basic operation of the SJ-RC-IGBT according to this embodiment are identical to the corresponding constitutions of the SJ-RC-IGBT according to the art of premise. Therefore, the description of these identical points is omitted.

B-1. Forward Output Characteristics

The present applicant carried out simulations under appropriate control of the repetition pitch of the first drift layer (N-drift layers 1 and P-drift layers 2), the thickness L1 of this repetition structure, the impurity concentration of the N-drift layers 1, the thickness and impurity concentration of the N buffer layer 11, and the repetition pitch L3 of the collector layer (P collector layers 12 and N collector layers 13). As a result, the present applicant found that the preferable impurity concentrations of the N-drift layers 1 and the P-drift layers 2 were $1\times10^{15}$ atms/cm$^3$ or higher and lower than $2\times10^{16}$ atms/cm$^3$, and that the preferable thicknesses of N-drift layers 1 and the P-drift layers 2 were 10 μm or larger and smaller than 50 μm. In addition, the present applicant found that the preferable impurity concentration of the N buffer layer 11 was $1\times10^{15}$ atms/cm$^3$ or higher and lower than $2\times10^{16}$ atms/cm$^3$, and that the preferable thickness of N buffer layer 11 was 2 μm or larger and smaller than 15 μm. Accordingly, MOSFET operation is allowed even at a high current density in the forward output characteristics of the SJ-RC-IGBT.

FIG. 2 shows an example of combinations of parameters (Aa, Ab, Ac, Ad, Bc, Bd, Db, Bc2, and Bd2) satisfying the foregoing conditions. FIG. 3 shows the forward characteristics of Aa, Ab, Ac, and Bd2 in these combinations, and of an IGBT and an MOSFET having conventional structures.

When the parameters in FIG. 2 are used, it is found from FIG. 3 that the current density at the connection point between the MOSFET operation and the IGBT operation falls within the range from 50 to 60 A/cm$^2$ particularly in the case of Ac and Bd2. Accordingly, the current density at the connection point becomes high in comparison with the conventional IGBT which exhibits a current density of approximately 20 A/cm$^2$ at the connection point. The thicknesses (L1) of the N-drift layers 1 and the P-drift layers 2 lies within the range from 30 to 45 μm. Moreover, when the impurity concentrations of the N-drift layers 1, P-drift layers 2, and N buffer layer 11 are set to the values shown above, injection of holes from the P collector layers 12 into the N buffer layer 11 and N-drift layers 1 is easily achieved. Accordingly, the snapback voltage lowers, wherefore the MOSFET operation having low ON-state resistance is performed at the collector current density in the range from 20 to 50 A/cm$^2$. By performing the MOSFET operation in a wide range of the current density approximately from 1/5 to 1/2 of the rated current density (100 A/cm$^2$), and by controlling the parameters of the respective parts, the current density at the connection between the MOSFET operation and the IGBT operation can be raised to a value approximately ½ of the rated current density.

Further, when the width of the P collector layers 12 is set to a width larger than the width of the N collector layers 13, injection of holes from the P collector layers 12 can be easily achieved. Accordingly, a low snapback voltage and a low ON-state resistance can be realized. For lowering the snapback voltage, it is required that voltage drop is generated in the N buffer layer 11 in the horizontal direction in FIG. 1 so that the potential difference between the intermediate points of the P collector layers 12 and the N collector layers 13 becomes 0.5 V or higher, preferably 0.7 V or higher, at the current density at the time of the snapback peak voltage. When the width (in the horizontal direction in FIG. 1) of the P collector layers 12 is set to a large width for meeting this requirement, injection of holes from the collector electrode 14 is easily achieved. Accordingly, the characteristics of the MOSFET having a low snapback voltage and a low ON-state resistance are realized. Moreover, the MOSFET operation range can be widened.

In addition, as shown in FIG. 8, the snapback voltage can lower as the repetition pitch of the P collector layers 12 and the N collector layers 13 increases. It is preferable that the repetition pitch of the P collector layers 12 and the N collector layers 13 is equal to or longer than 5 times longer than the repetition pitch of the N-drift layers 1 and the P-drift layers 2, and shorter than 20000 times longer than the repetition pitch of the N-drift layers 1 and the P-drift layers 2.

B-2. Modified Example

FIG. 4 is a cross-sectional view of an SJ-RC-IGBT according to a modified example. This SJ-RC-IGBT has a super junction structure containing the N-drift layers 1, the P-drift layers 2, and insulating layers 15 repeated in this order in the horizontal direction in the figure. Other constitutions are similar to the corresponding constitutions of the structure shown in FIG. 1. This SJ-RC-IGBT similarly allows execution of the MOSFET operation having a low ON-state resistance at a current density higher than that of the conventional art by setting the impurity concentrations of the N-drift layers 1 and the P-drift layers 2 to $1 \times 10^{15}$ atms/cm$^3$ or higher and lower than $2 \times 10^{16}$ atms/cm$^3$, and the thicknesses of N-drift layers 1 and the P-drift layers 2 to 10 μm or larger and smaller than 50 μm, and by setting the impurity concentration of the N buffer layer 11 to $1 \times 10^{15}$ atms/cm$^3$ or higher and lower than $2 \times 10^{16}$ atms/cm$^3$, and the thickness of N buffer layer 11 to 2 μm or larger and smaller than 15 μm.

Moreover, similar effects can be offered by an SJ-RC-IGBT of the present invention which has a super junction structure including the N-drift layers 1 and the P-drift layers 2, and further containing insulating layers between the N-drift layers 1 and the P-drift layers 2 in appropriate manners.

Furthermore, as illustrated in FIG. 5, a carrier accumulating layer 15 having a higher N-type impurity concentration than that of the N-drift layer 3 may be further provided between the N-drift layer 3 and the P base layer 4 in a condition in contact with the P base layer 4 in addition to the structure of the SJ-RC-IGBT shown in FIG. 1. When the present invention is applied to the SJ-RC-IGBT having the structure shown in FIG. 5, the ON-state voltage in the IGBT operation range can be further reduced by the effect of the carrier accumulating layer 15. Further, the carrier accumulating layer 15 may be provided on the SJ-RC-IGBT having the structure shown in FIG. 4.

B-3. Effects

The insulating gate-type bipolar transistor according to the present invention includes: the first conductivity-type N buffer layer 11 (buffer layer); the first drift layer provided on the first main surface of the N buffer layer 11; the first conductivity-type N drift layer 3 (second drift layer) provided on the first drift layer; the second conductivity-type P base layer 4 (base layer) provided on the N drift layer 3; the first conductivity-type N emitter layers 5 (emitter layers) selectively provided on the front surface of the P base layer 4; the gate electrodes 8 penetrating from the front surfaces of the N emitter layers 5 into the N drift layer 3 to be embedded with the insulating gate films 7 interposed between the gate electrodes 8 and the surroundings; the emitter electrode 10 having conductivity with the N emitter layers 5; the collector layer provided on the second main surface of the N buffer layer 11; and the collector electrode 14 provided on the collector layer. The first drift layer has a structure containing the first conductivity-type N-drift layers 1 (first layers) and the second conductivity-type P-drift layers 2 (second layers) repeated in the horizontal direction. The collector layer (12, 13) has a structure containing the second conductivity-type first collector layers (12) and the first conductivity-type second collector layers (13) repeated in the horizontal direction. The first drift layer has an impurity concentration of $1 \times 10^{15}$ atms/cm$^3$ or higher and lower than $2 \times 10^{16}$ atms/cm$^3$, and a thickness of 10 μm or larger and smaller than 50 μm. The N buffer layer 11 has an impurity concentration of $1 \times 10^{15}$ atms/cm$^3$ or higher and lower than $2 \times 10^{16}$ atms/cm$^3$, and a thickness of 2 μm or larger and smaller than 15 μm. Accordingly, the forward voltage drop can be lowered as that of an MOSFET at a low current density. Moreover, the thickness of the first drift layer can be reduced, wherefore the withstand voltage can be raised. Furthermore, the upper limit of the current density for performing MOSFET operation can be raised higher than that density in the conventional art.

In addition, similar effects can be offered by the insulating gate-type bipolar transistor which contains insulating layers appropriately provided between the N-drift layers 1 and the P-drift layers 2.

Alternatively, the insulating gate-type bipolar transistor according to the present invention includes: the first conductivity-type N buffer layer 11 (buffer layer); the first drift layer provided on the first main surface of the N buffer layer 11; the first conductivity-type N drift layer 3 (second drift layer) provided on the first drift layer; the second conductivity-type P base layer 4 (base layer) provided on the N drift layer 3; the first conductivity-type N emitter layers 5 (emitter layers) selectively provided on the front surface of the P base layer 4; the gate electrodes 8 penetrating from the front surfaces of the N emitter layers 5 into the N drift layer 3 to be embedded with the insulating gate films 7 interposed between the gate electrodes 8 and the surroundings; the emitter electrode 10 having conductivity with the N emitter layers 5; the collector layer provided on the second main surface of the N buffer layer 11; and the collector electrode 14 provided on the collector layer. The first drift layer has a structure containing the first conductivity-type N-drift layers 1 (first layers), the insulating layers 15, and the second conductivity-type P-drift layers 2 (second layers) repeated in this order in the horizontal direction. The collector layer has a structure containing the second conductivity-type P collector layers 12 (first collector layers) and the first conductivity-type N collector layers 13 (second collector layers) repeated in the horizontal direction. The first layers and the second layers have an impurity concentration of $1 \times 10^{15}$ atms/cm$^3$ or higher and lower than $2 \times 10^{16}$ atms/ cm³. The first drift layer has a thickness of 10 μm or larger and smaller than 50 μm. The buffer layer has an impurity concentration of $1\times10^{15}$ atms/cm³ or higher and lower than $2\times10^{16}$ atms/cm³, and a thickness of 2 μm or larger and smaller than 15 μm. Accordingly, the forward voltage drop can be lowered as that of an MOSFET at a low current density. Moreover, the thickness of the first drift layer can be reduced, wherefore the withstand voltage can be raised. Furthermore, the upper limit of the current density for performing MOSFET operation can be raised higher than that density in the conventional art.

Moreover, when the first conductivity-type carrier accumulating layer having a higher impurity concentration than the impurity concentration of the second drift layer is further provided between the second drift layer and the base layer in a condition in contact with the base layer, the ON-state voltage can be further lowered in the IGBT operation range in the forward output characteristics.

Moreover, the repetition pitch of the P collector layers 12 and the N collector layers 13 is equal to or longer than 5 times longer than the repetition pitch of the N-drift layers 1 and the P-drift layers 2, and shorter than 20000 times longer than the repetition pitch of the N-drift layers 1 and the P-drift layers 2. In this case, the snapback voltage at the connection point between the MOSFET operation range and the IGBT operation range can be lowered in the forward output characteristics.

Moreover, when the width of the second conductivity-type collector layers is determined such that voltage drop of 0.5 V or higher and lower than 0.7 V is generated in the buffer layer between intermediate positions of the P collector layers 12 and the N collector layers 13 at the current density at the time of snapback peak voltage, the snapback voltage at the connection point between the MOSFET operation range and the IGBT operation range can be lowered in the forward output characteristics.

Further, according to the present invention, modifications and omissions may be made to the embodiments in appropriate manners without departing from the scope of the present invention.

REFERENCE SIGNS LIST 1, 3 N-drift layer
2 P-drift layer
4 P base layer
5 N emitter layer
6 P+ contact layer
7 insulating gate film
8 gate electrode
9 interlayer dielectric
10 emitter electrode
11 N buffer layer
12 P collector layer
13 N collector layer
14 collector electrode
15 insulating layer

The invention claimed is:

1. An insulating gate-type bipolar transistor comprising:
a first conductivity-type buffer layer;
a first drift layer provided on a first main surface of said buffer layer;
a first conductivity-type second drift layer provided on said first drift layer;
a second conductivity-type base layer provided on said second drift layer;
a first conductivity-type emitter layer selectively provided on the front surface of said base layer;
a gate electrode penetrating from the front surface of said emitter layer into said second drift layer to be embedded with an insulating gate film interposed between the gate electrode and the surroundings;
an emitter electrode having conductivity with said emitter layer;
a collector layer provided on a second main surface of said buffer layer; and
a collector electrode provided on said collector layer, wherein
said first drift layer has a structure containing first conductivity-type first layers and second conductivity-type second layers repeated in the horizontal direction,
said collector layer has a structure containing second conductivity-type first collector layers and first conductivity-type second collector layers repeated in the horizontal direction,
said first drift layer has an impurity concentration of $1\times10^{15}$ atoms/cm³ or higher and lower than $2\times10^{16}$ atoms/cm³, and a thickness of 10 μm or larger and smaller than 50 μm, and
said buffer layer has an impurity concentration of $1\times10^{15}$ atoms/cm³ or higher and lower than $2\times10^{16}$ atoms/cm³, and a thickness of 2 μm or larger and smaller than 15 μm.

2. The insulating gate-type bipolar transistor according to claim 1, wherein insulating layers are appropriately provided between said first layers and said second layers.

3. The insulating gate-type bipolar transistor according to claim 1, further comprising
a first conductivity-type carrier accumulating layer having a higher impurity concentration than the impurity concentration of said second drift layer between said second drift layer and said base layer in a condition in contact with said base layer.

4. The insulating gate-type bipolar transistor according to claim 1, wherein the repetition pitch of said collector layer is equal to or longer than 5 times longer than the repetition pitch of said first drift layer, and shorter than 20000 times longer than the repetition pitch of said first drift layer.

5. The insulating gate-type bipolar transistor according to claim 1, wherein the width of said second conductivity-type collector layers is determined such that voltage drop of 0.5 V or higher and lower than 0.7 V is generated in said buffer layer between intermediate positions of said first collector layers and said second collector layers at the current density at the time of snapback peak voltage.

6. An insulating gate-type bipolar transistor comprising:
a first conductivity-type buffer layer;
a first drift layer provided on a first main surface of said buffer layer;
a first conductivity-type second drift layer provided on said first drift layer;
a second conductivity-type base layer provided on said second drift layer;
a first conductivity-type emitter layer selectively provided on the front surface of said base layer;
a gate electrode penetrating from the front surface of said emitter layer into said second drift layer to be embedded with an insulating gate film interposed between the gate electrode and the surroundings;
an emitter electrode having conductivity with said emitter layer;
a collector layer provided on a second main surface of said buffer layer; and
a collector electrode provided on said collector layer, wherein said first drift layer has a structure containing first conductivity-type first layers, insulating layers, and second conductivity-type second layers repeated in this order in the horizontal direction, said collector layer has a structure containing second conductivity-type first collector layers and first conductivity-type second collector layers repeated in the horizontal direction, said first layers and said second layers have an impurity concentration of $1\times10^{15}$ atoms/cm$^3$ or higher and lower than $2\times10^{16}$ atoms/cm$^3$, said first drift layer has a thickness of 10 μm or larger and smaller than 50 μm, and said buffer layer has an impurity concentration of $1\times10^{15}$ atoms/cm$^3$ or higher and lower than $2\times10^{16}$ atoms/cm$^3$, and a thickness of 2 μm or larger and smaller than 15 μm.

7. The insulating gate-type bipolar transistor according to claim 6, further comprising a first conductivity-type carrier accumulating layer having a higher impurity concentration than the impurity concentration of said second drift layer between said second drift layer and said base layer in a condition in contact with said base layer.

8. The insulating gate-type bipolar transistor according to claim 6, wherein the repetition pitch of said collector layer is equal to or longer than 5 times longer than the repetition pitch of said first drift layer, and shorter than 20000 times longer than the repetition pitch of said first drift layer.

9. The insulating gate-type bipolar transistor according to claim 6, wherein the width of said second conductivity-type collector layers is determined such that voltage drop of 0.5 V or higher and lower than 0.7 V is generated in said buffer layer between intermediate positions of said first collector layers and said second collector layers at the current density at the time of snapback peak voltage.

* * * * *